(12) United States Patent
Chaintreuil et al.

(10) Patent No.: US 10,073,129 B2
(45) Date of Patent: Sep. 11, 2018

(54) METHOD AND DEVICE FOR DETECTING AN ELECTRIC ARC IN A PHOTOVOLTAIC INSTALLATION

(71) Applicant: COMMISSARIAT A L'ENERGIE ATOMIQUE ET AUX ENERGIES ALTERNATIVES, Paris (FR)

(72) Inventors: Nicolas Chaintreuil, Montmelian (FR); Cédric Gouy-Pailler, Paris (FR); Sylvain Lespinats, Aix-les-Bains (FR); Alexandre Plissonnier, Pont-de-Claix (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 408 days.

(21) Appl. No.: 14/769,561

(22) PCT Filed: Feb. 21, 2014

(86) PCT No.: PCT/EP2014/053395
§ 371 (c)(1),
(2) Date: Aug. 21, 2015

(87) PCT Pub. No.: WO2014/128244
PCT Pub. Date: Aug. 28, 2014

(65) Prior Publication Data
US 2016/0003883 A1    Jan. 7, 2016

(30) Foreign Application Priority Data
Feb. 22, 2013   (FR) ...................................... 13 51555

(51) Int. Cl.
*G01R 31/02* (2006.01)
*H02S 50/10* (2014.01)
*H02H 3/16* (2006.01)

(52) U.S. Cl.
CPC ............. *G01R 31/025* (2013.01); *H02H 3/16* (2013.01); *H02S 50/10* (2014.12)

(58) Field of Classification Search
CPC ............................ H02H 9/541; H02H 1/0015
(Continued)

(56) References Cited

U.S. PATENT DOCUMENTS

| | | | |
|---|---|---|---|
| 6,892,178 B1 | 5/2005 | Zacharia | |
| 7,366,622 B1 | 4/2008 | Nemir et al. | |

(Continued)

FOREIGN PATENT DOCUMENTS

| | | |
|---|---|---|
| EP | 2 393 178 A2 | 12/2011 |
| FR | 2 912 848 A1 | 8/2008 |

(Continued)

OTHER PUBLICATIONS

Braun, "Signal processing for fault detection in PV arrays".*
(Continued)

*Primary Examiner* — Dharti Patel
(74) *Attorney, Agent, or Firm* — Westerman, Hattori, Daniels & Adrian, LLP

(57) ABSTRACT

Method for detecting an electric arc in a photovoltaic installation, characterized in that it comprises the following steps:
- Measurement (E6) of voltage values at at least one site of the electrical circuit of the photovoltaic installation;
- Digitization (E8) of the measured voltage values so as to form a data sampling x;
- Computation (E10) of a first indicator of presence of an electric arc, on the basis of a statistical computation on the data sampling x, from among the variance, a value analogous to the variance, or the interquartile range of the data sampling;
- Computation (E10) of a second indicator of presence of an electric arc, on the basis of a statistical computation (Continued)

on the data sampling based on one or more estimations of the mean and/or of the median of the data sampling; Comparison (E12) of the first and second indicators of presence of an electric arc with respective thresholds so as to deduce therefrom the presence or absence of an electric arc within the photovoltaic installation.

20 Claims, 7 Drawing Sheets

(58) Field of Classification Search
USPC .......................................................... 361/2–6
See application file for complete search history.

(56) References Cited

U.S. PATENT DOCUMENTS

| | | |
|---|---|---|
| 8,570,017 B2 | 10/2013 | Perichon et al. |
| 2010/0164459 A1 | 7/2010 | Perichon et al. |
| 2011/0267721 A1 | 11/2011 | Chaintreuil et al. |
| 2011/0301772 A1 | 12/2011 | Zuercher et al. |
| 2012/0318320 A1 | 12/2012 | Robbins |
| 2014/0301008 A1 | 10/2014 | Gouy-Pailler et al. |
| 2015/0357972 A1 | 12/2015 | Lespinats et al. |
| 2016/0276977 A1 | 9/2016 | Chaintreuil et al. |

FOREIGN PATENT DOCUMENTS

| | | | |
|---|---|---|---|
| WO | 98/27476 A1 | 6/1998 | |
| WO | 2010/072717 A1 | 7/2010 | |
| WO | 2011/058433 A1 | 5/2011 | |
| WO | 2013/83723 A1 | 6/2013 | |

OTHER PUBLICATIONS

International Search Report and Written Opinion dated Feb. 18, 2013 issued in international application No. PCT/EP2012/074696 corresponding to co-pending U.S. Appl. No. 14/363,987; with English translation (20 pages) (D1 Schimpf et al. cited in the ISR and FR2912848 and WO2010/072717 cited in the description of the co-pending application, and corresponding US20110267721 and US20100164459, are not listed in this IDS since they were already listed in the IDS filed Aug. 21, 2015).

Kusljevic et al., "Active power measurement algorithm for power system signals under non-sinusoidal conditions and wide-range frequency deviations", IET Generation; Transmission & Distribution, vol. 3, No. 1, 2009, pp. 57-65; in English; cited in the ISR of co-pending U.S. Appl. No. 14/363,987.
International Search Report and Written Opinion dated Jun. 24, 2014 issued in international application No. PCT/EP2014/053438 corresponding to co-pending U.S. Appl. No. 14/767,628; with English translation (21 pages) (D1 Schimpf et al. cited in ISR and FR2912848 and WO2010/072717 cited in the description of the co-pending application, and corresponding US20110267721 and US20100164459, are not listed in this IDS since they were already listed in the IDS filed Aug. 21, 2015).
Yao et al., "The Detection of DC Arc Fault: Experimental Study and Fault Recognition", Applied Power Electronics Conference and Exposition (APEC), 2012 27th Annual IEEE, Feb. 5, 2012, pp. 1720-1727; in English; cited in the ISR of co-pending U.S. Appl. No. 14/767,628.
Final Office Action dated May 11, 2017 in co-pending U.S. Appl. No. 14/363,987; without returned SB08 (11 pages).
Office Action dated Oct. 13, 2017 in co-pending U.S. Appl. No. 14/767,628; without returned SB08 (10 pages) (the Schimpf publication and US7366622 cited in the Office Action are not listed in the IDS since they were already listed in the IDS filed Apr. 5, 2017 and Jul. 13, 2017, respectively).
International Search Report and the Written Opinion of the International Searching Authority dated Jun. 27, 2014, issued in counterpart International Application No. PCT/EP2014/053395 (w/ English partial translation and partial machine translation) (20 pages).
Braun et al., "Signal Processing for Fault Detection in Photovoltaic Arrays", 2012 IEEE International Conference on Acoustics, Speech, and Signal Processing (ICASSP 2012), dated Mar. 25, 2012, pp. 1681-1684; cited in the ISR (in English) (4 pages).
Schimpf et al., "Recognition of Electric Arcing in the DC-wiring of Photovoltaic Systems", NTelecommunications Energy Conference, 2009, INTELEC 2009, 31st International, IEEE, Oct. 18, 2009, pp. 1-6; cited in the ISR (in English) (6 pages).
Office Action dated Oct. 6, 2016 in co-pending U.S. Appl. No. 14/363,987; with PTO892; without returned SB08 (9 pages) (US20140301008 cited in the Office Action is not listed in this IDS since it is listed in another IDS form filed concurrently).
Office Action dated Mar. 31, 2017 in co-pending U.S. Appl. No. 14/767,628; with PTO892; without returned SB08 (10 pages) (US20110267721 cited in the Office Action is not listed in this IDS since it was already listed in the IDS filed Aug. 21, 2015).

\* cited by examiner

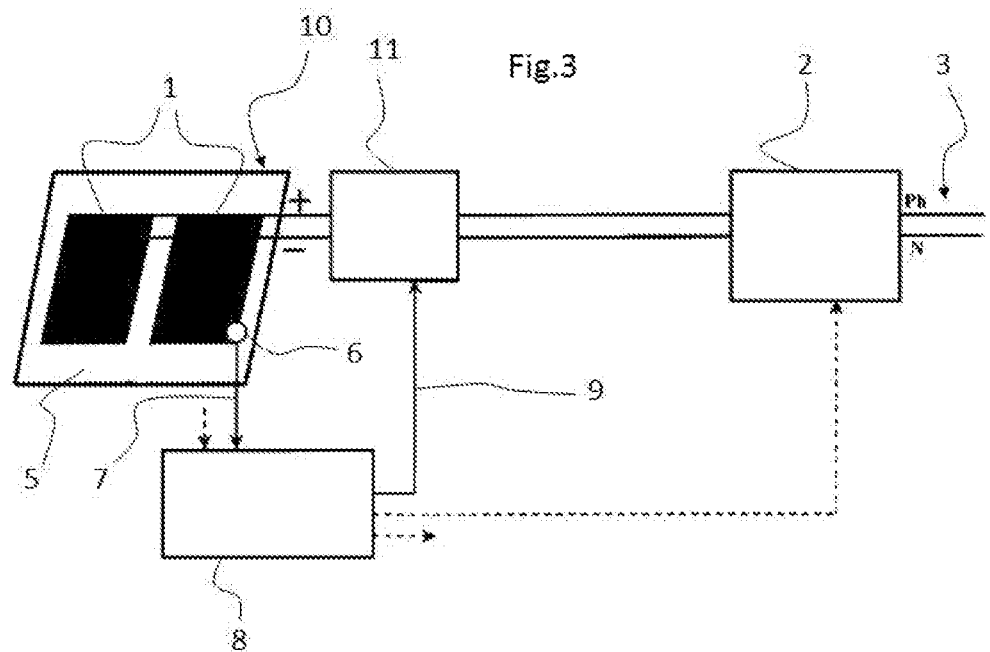
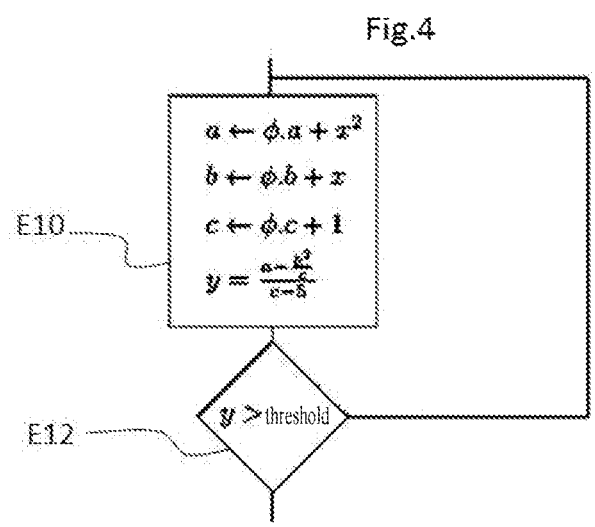

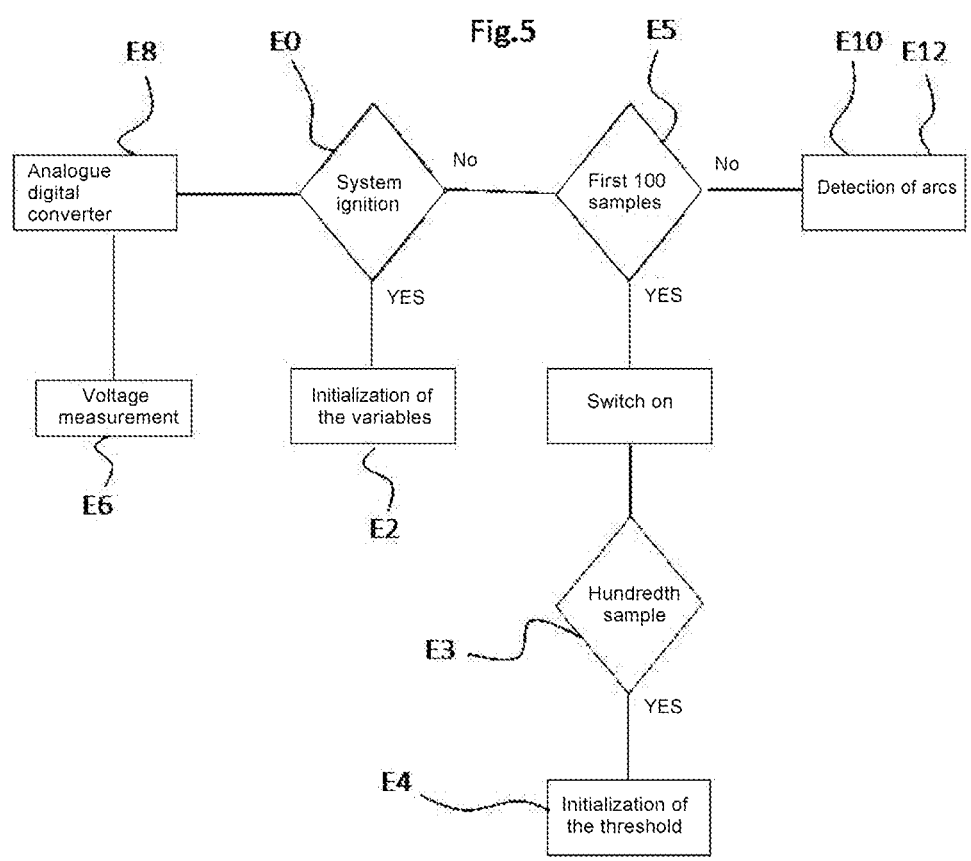

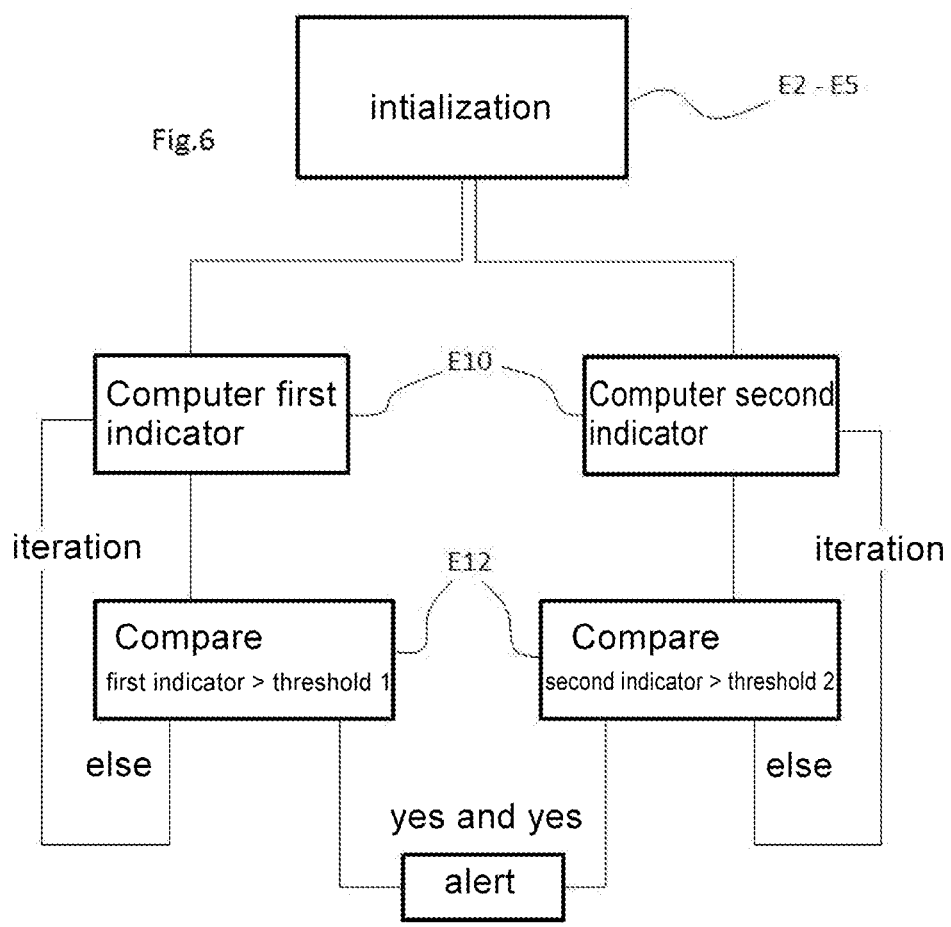

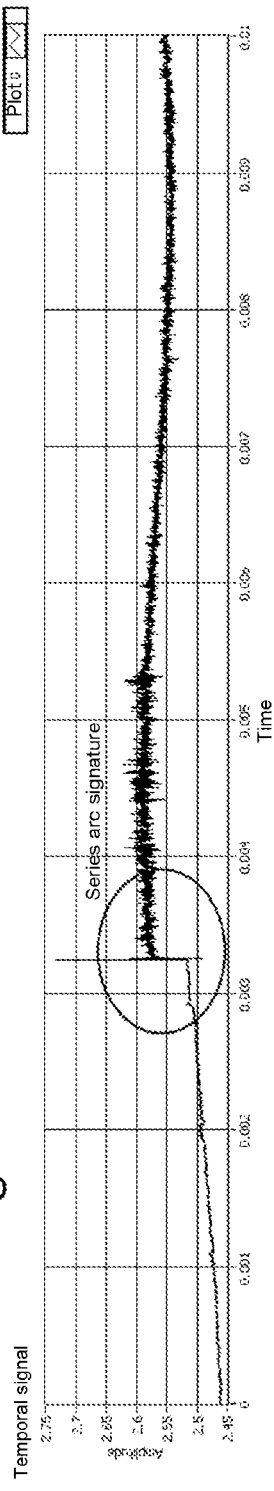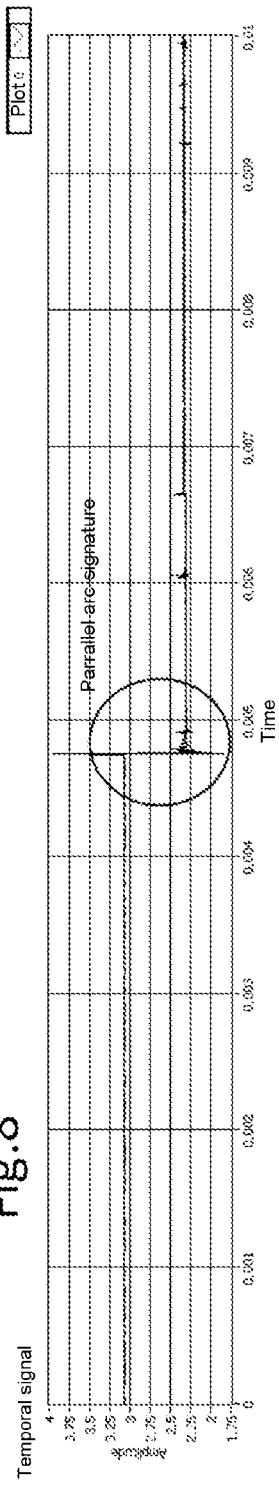

METHOD AND DEVICE FOR DETECTING AN ELECTRIC ARC IN A PHOTOVOLTAIC INSTALLATION

The invention relates to a method for detecting an electric arc in a photovoltaic system. It also relates to a safety device detecting the occurrence of electric arcs, and a photovoltaic module and a photovoltaic system which are equipped with such a safety device detecting the occurrence of electric arcs.

Photovoltaic installations operate at high DC voltage and current, thereby engendering risks of occurrence of electric arcs. Such electric arcs may arise following a handling error, for example if an operator ill-advisedly opens a live connector, or following the degradation of the connections of the installation. These electric arcs generate strong plasma heat for a long duration since under DC voltage, the value of the voltage is never zero in contrast to an AC system, and are therefore very dangerous for people and installations. Moreover, the integration of photovoltaic modules into the roofing of buildings risks setting fire to timber frames in case of electrical arcing.

Photovoltaic installations can be linked to the electrical network by way of an inverter. In such a configuration, safety systems exist which make it possible to detect a possible electric arc arising on the electrical link between a field of photovoltaic modules and the inverter. However, these systems are insufficient since such an electric arc is liable to occur at the level of a photovoltaic module itself. No safety solution against such a risk exists.

Document WO2010072717 of the prior art proposes the detection of an electric arc in a photovoltaic installation on the basis of the analysis of an ultrasound wave and the recognition of the ultrasound signature of an electric arc in this wave. Accordingly, this solution analyses the ultrasound signatures continuously. This results in a scheme requiring a complex computation and an expensive device.

Document FR2912848 describes a simplified scheme for detecting an electric arc on the basis of the simple measurement of voltage and of the detection of its fast increase. However, this scheme is insufficient to distinguish between an electric arc and various distinct events which also bring about a voltage increase.

Thus, a general object of the invention is to propose a solution for detecting an electric arc in a photovoltaic installation that is simple, inexpensive and reliable, so as to improve the safety of such installations.

For this purpose, the invention is based on a method for detecting an electric arc in a photovoltaic installation, characterized in that it comprises the following steps:
Measurement of voltage values at at least one site of the electrical circuit of the photovoltaic installation;
Digitization of the measured voltage values so as to form a data sampling x;
Computation of a first indicator of presence of an electric arc, on the basis of a statistical computation on the data sampling x, from among the variance, a value analogous to the variance, or the interquartile range of the data sampling;
Computation of a second indicator of presence of an electric arc, on the basis of a statistical computation on the data sampling based on one or more estimations of the mean and/or of the median of the data sampling;
Comparison of the first and second indicators of presence of an electric arc with respective thresholds so as to deduce therefrom the presence or otherwise of an electric arc within the photovoltaic installation.

The step of computing a first indicator of presence of an electric arc can be based on a value analogous to the variance and take into account a forgetting factor $\phi$ and/or the step of computing a second indicator of presence of an electric arc can take into account a forgetting factor $\phi$.

The forgetting factor can be combined with each sampling datum x so as to make it possible to define an ever smaller weight to the oldest data of the sampling at each iteration, so as to take into account the history of the measured values and focus the algorithm on a near time period.

The forgetting factor can depend on a sampling frequency.

The forgetting factor can be constant and chosen by complying with the rules defined by the following table:

| Sampling frequency $F_{smp}$ | Forgetting factor $\Phi$ lies in the interval |
|---|---|
| 50-300 kHz inclusive | [0.965; 0.975] |
| 301-750 kHz inclusive | [0.975; 0.985] |
| 751 KHz-8 Mhz inclusive | [0.985; 0.995] |

The step of computing a first indicator of presence of an electric arc can comprise the computation of three variables a, b, c at each iteration providing a new sampling datum x, by taking account of the history of these variables a, b, c, the square of the new sampling datum $x^2$ and the new sampling datum x itself.

The computation of a first indicator of presence of an electric arc can implement the following computations, repeated for each digitized datum x:
firstly, three variables a, b, and c are recomputed in the following manner, on the basis of the previous values of these variables a, b and c:

$$a \leftarrow \phi a + x^2$$

$$b \leftarrow \phi b + x$$

$$c \leftarrow \phi c + 1$$

thereafter, the first indicator y of presence of electric arc is computed through the following formula:

$$-y = \frac{a - b^2/c}{c - 5}$$

The computation of the second indicator of presence of an electric arc can implement the following computations, repeated for each digitized datum x:
firstly, two variables b and c are recomputed in the following manner, on the basis of the previous values of these variables b and c:

$$b \leftarrow \phi b + x$$

$$c \leftarrow \phi c + 1$$

where $\phi$ is a forgetting factor lying between 0 and 1 inclusive,
thereafter, the second indicator m of presence of electric arc is computed through the following formula:

$$m = b/c.$$

The computation of the second indicator of presence of an electric arc can be based on a combination of two, high and low frequency, estimations of the mean of the sampling data.

The computation of the second indicator of presence of an electric arc can implement the following computations, repeated for each digitized datum x:
  firstly, two variables b and c are recomputed in the following manner, on the basis of the previous values of these variables b and c:

$b \leftarrow \phi b + x$ $c \leftarrow \phi c + 1$ where $\phi$ is a forgetting factor lying between 0 and 1 inclusive,
  thereafter, a first high-frequency mean estimation $m_{HF}$ is computed through the following formula:

$$m_{HF} = \frac{b}{c}$$

and a second low-frequency mean estimation $m_{LF}$ is computed through the following formula:

$m_{LF} = \psi m_{LF} + (1-\psi) m_{HF}$ where $\psi$ represents a second forgetting factor lying between 0.9 and 1 inclusive or defined as a function of the sampling frequency by the following table;

| Sampling frequency $F_{smp}$ | Forgetting factor $\Psi$ lies in the interval |
| --- | --- |
| 50-300 kHz inclusive | [0.9; 1] |
| 301-750 kHz inclusive | [0.95; 1] |
| 751 KHz-8 Mhz | [0.99; 1] | then the second indicator is computed on the basis of the two means, high and low frequency, as their difference.

The method for detecting an electric arc in a photovoltaic installation can comprise a phase of initializing the processing during the ignition which comprises the devising of the two threshold values for respectively the two indicators of presence of an electric arc on the basis of the first voltage measurements.

If during the comparison step the two indicators of presence of an electric arc exceed their pre-established threshold value, then it can be estimated that an electric arc exists within the photovoltaic installation, and then the method can comprise a step consisting in intervening automatically on the electrical circuit of the photovoltaic installation in case of detection of an electric arc, so as to make the photovoltaic installation safe.

The invention also pertains to a safety device for a photovoltaic installation, comprising one or more voltage measurement sensor(s), linked by a communication link to a processing unit, comprising an analogue-digital converter for digitizing the measurements received by the voltage measurement sensor(s), characterized in that the processing unit implements the method for detecting an electric arc in the photovoltaic installation, such as described above.

The processing unit can be linked by a communication means to an intervention device whose function is to interrupt the electric arc, so as to eliminate any risk.

The invention also pertains to a photovoltaic installation, characterized in that it comprises at least one safety device such as described hereinabove.

These subjects, characteristics and advantages of the present invention will be set forth in detail in the following description of a particular mode of execution given without limitation in conjunction with the attached figures among which:

FIG. 1 schematically illustrates a photovoltaic installation.

FIG. 2 represents an example of evolution of the voltage within a photovoltaic installation as a function of time in the presence of an electric arc.

FIG. 3 schematically illustrates a safety device associated with a photovoltaic installation according to a mode of execution of the invention.

FIG. 4 illustrates a few steps of the method of detecting an electric arc within a photovoltaic installation according to a mode of execution of the invention.

FIG. 5 illustrates more globally the initial phase of the method of detecting an electric arc within a photovoltaic installation according to a mode of execution of the invention.

FIG. 6 illustrates more globally the computing phase of the method of detecting an electric arc within a photovoltaic installation according to a mode of execution of the invention.

FIG. 7 represents an electrical signature of a series arc within a photovoltaic installation.

FIG. 8 represents an electrical signature of a parallel arc within a photovoltaic installation.

Figure 1:
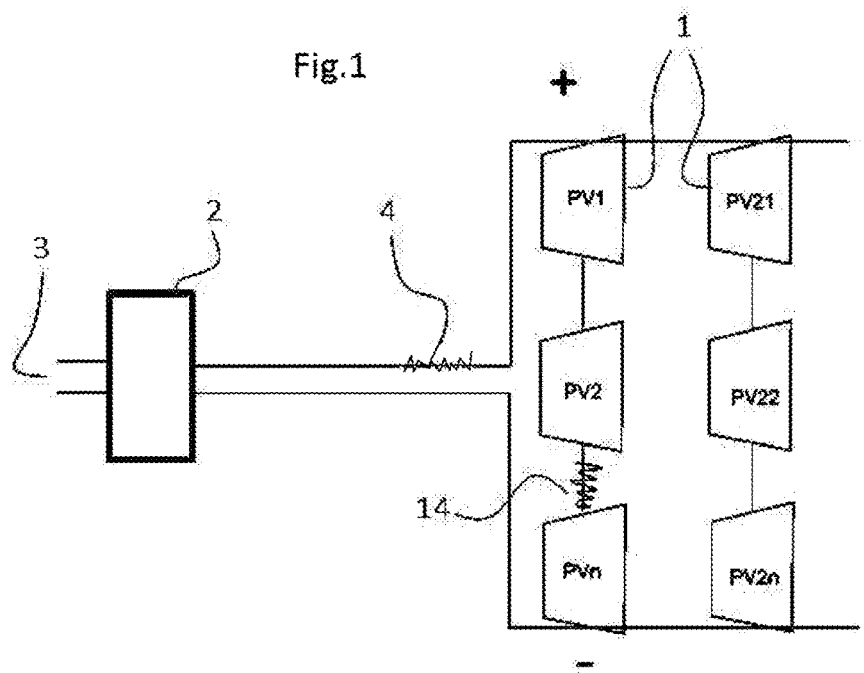

The invention is based on the only measurement of the voltage within a photovoltaic installation. The latter, represented schematically in FIG. 1, comprises several photovoltaic modules 1 (PVi) linked to an inverter 2 which converts the DC current produced by the photovoltaic modules 1 into an AC current, for a link on a standard electrical network 3, not represented.

On the basis of a voltage measurement, the invention seeks to deduce the presence or absence of an electric arc within a photovoltaic installation. Such an electric arc can be situated at the level of one or more photovoltaic module(s) 1, in particular on a link comprising several photovoltaic modules disposed in series: one then speaks of a "series" electric arc 14. Such an electric arc can also be situated between these photovoltaic modules and an inverter 2, or at any site on a parallel link with several modules: one then speaks of a "parallel" electric arc 4.

Figure 2:
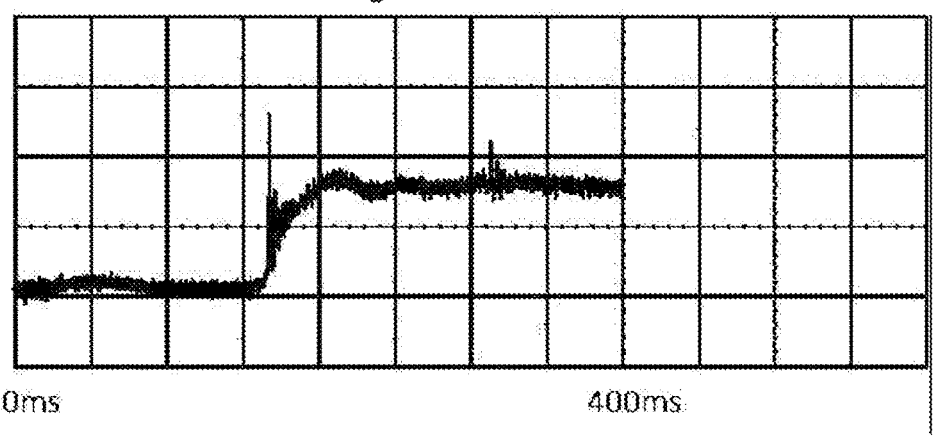

A series electric arc causes a significant increase in the voltage within the photovoltaic installation. This voltage, measured on an electrical link undergoing a series electric arc, can take a form such as illustrated in FIG. 2 according to an example. The increase in the voltage signal may occur at the same time as the arc, and last from a few milliseconds to a few hours. More generally, the signal amplitude obtained depends on the position of the detector and other parameters. This increase in the voltage brings about an increase in the variability of the signal.

FIG. 3 schematically represents a safety device for a photovoltaic installation 10 such as described in FIG. 1, which comprises two photovoltaic modules 1, by way of simplified example, mounted on a chassis 5, which are linked to the traditional electrical network 3 by way of an inverter 2. The safety device comprises one or more voltage measurement sensor(s) 6, positioned for example at the level of a photovoltaic module 1 and/or at any other site of the electrical circuit of the photovoltaic installation. This (or these) voltage measurement sensor 6 is linked by a communication link 7 to a processing unit 8 able to analyse the data transmitted by the voltage measurement sensor(s) 6. This processing unit 8 is itself linked by a communication means 9 to an intervention device 11 whose function is to interrupt the electric arc on request of the processing unit 8 in case of electric arc, so as to eliminate any electrical risk and any future deterioration.

The processing unit 8 comprises an analogue-digital converter, to digitize the data received from the voltage measurement sensor(s). This unit's function is to analyse the data received by the voltage measurement sensor(s) 6 and it implements a method for detecting electric arcs, which will be detailed hereinbelow. Accordingly, said unit can comprise a computation unit, like a microcontroller, and storage means, or more generally any hardware component and/or software component. By way of remark, since the data to be processed are digitized, it is possible to use one or more microcontrollers already existing within a photovoltaic installation to implement the electric arc detection method which will be detailed hereinbelow, without the addition of an extra component. The solution is therefore inexpensive.

Lastly, the safety device 10 can be either disposed on one of the terminals at the output of the photovoltaic installation, or be situated on each photovoltaic module, for example in its junction box. Any intermediate solution is naturally conceivable. It allows an intervention matched to the type of electric arc detected, series or parallel, and preferably in a localized manner, as close as possible to the location of the electric arc.

The electric arc detection method according to the invention will now be detailed.

It comprises a step of sampling voltage values. Accordingly, various voltage values are measured in the course of time, during a measurement step E6, and digitized, during a digitization step E8, by the digital converter of the processing unit, according to a chosen sampling frequency $F_{ech}$. Thereafter, these values are processed to deduce therefrom a detection of occurrence or otherwise of an electric arc.

It comprises the estimation of two complementary indicators, according to a parallel computation, so as to achieve reliable detection of the presence of an electric arc.

Several modes of realization of the estimation of the first indicator will now be detailed.

According to a first mode of realization, for each sample of voltage values measured and converted by the digital converter to provide data x, the following computations are implemented:

Firstly, the three variables a, b, and c are defined in the following manner:

$a \leftarrow \phi a + x^2$ $b \leftarrow \phi b + x$ $c \leftarrow \phi c + 1$ where $\phi$ is a forgetting factor, which is constant and initialized as a function of the chosen sampling frequency. By way of example, the forgetting factor can be defined according to the value of the sampling frequency $F_{smp}$ by complying with the rules according to the following table:

| Sampling frequency $F_{smp}$ | Forgetting factor $\Phi$ lies in the interval |
|---|---|
| 50-300 kHz inclusive | [0.965; 0.975] |
| 301-750 kHz inclusive | [0.975; 0.985] |
| 751 KHz-8 Mhz | [0.985; 0.995] |

As a variant, this forgetting factor might not depend on the sampling frequency, and might be for example a constant less than 1.

Lastly, the first indicator y, which represents a first value of estimation of presence of electric arc, is computed in the following manner:

$$y = \frac{a - b^2/c}{c - 5}$$

These computations of the three variables a, b, c and of the indicator y of presence of electric arc are carried out in a computation step E10 which is repeated for each new datum x of the sampling. Thus, at each iteration, the three variables are computed by taking into account their own past values, therefore a history of their values, and by taking into account the square of the sampling datum x as well as this sampling datum itself.

Finally, the electric arc detection method comprises a step E12 of comparing the first indicator y with a first threshold, so as to deduce therefrom, or otherwise, a risk of presence of an electric arc.

If y<threshold1, then the method considers that there is no presence of an electric arc. If y> threshold1, it is also necessary to verify the value of a second indicator, as will be explained further on, before concluding that an electric arc is present.

This first mode of realization of the computation of the first indicator makes it possible to use an indicator analogous to the statistical variance, that is to say considering the various moments of order 2 of the data of the sampling, but obtained in a more stable and simpler manner by virtue of the introduction of the three variables a, b, c mentioned and of an iterative computation involving very simple computations.

Thus, the principle adopted consists in defining an estimation value (first indicator) of presence of an electric arc, which value is related to the variance (analogous to the variance) of the values obtained during sampling, and combined with the taking into account of a forgetting factor $\phi$.

Indeed, according to this first mode of realization of the computation of the first indicator, a parameter, called the "forgetting factor", which depends on the sampling frequency $F_{smp}$, is used to take into account the history, near in time, of the measured voltage values, and thus focus the algorithm on the latest measurements. This forgetting factor thus makes it possible for example to dispense with a bandpass digital filter, which is always used in the prior art to eliminate certain noise which is not related to an electric arc, in particular the noise created by the communication signals which travel from the installation to the processing unit, and which exhibit in particular the feature of being of shorter duration. Moreover, the forgetting factor, in particular through its dependency on the sampling frequency, makes it possible to optimize the relationship between the sampling frequency and the processing performed, by avoiding the compulsory complex matching operations between the bandpass filters and the sampling frequency of the solutions of the prior art.

The previous iteration, schematically represented by FIG. 4, therefore makes it possible to add a lower weight to a datum older than another, to take account of the history of the data obtained and of their distribution over time. Any other computation making it possible to fix an ever smaller weight for each datum obtained at each iteration can make it possible to achieve as a variant a result utilizable to form variants of realization.

The electric arc detection method described above comprises a preliminary initialization step, which fixes the threshold value by taking into account the first voltage values measured on ignition E0 of the safety device.

At the initial instant, the variables a, b, c are initialized to 0, in an initialization step E2, and then computed according to the formulae explained hereinabove. The forgetting factor is likewise initialized as a function of the predefined rules such as explained hereinabove by way of example. Thereafter, the computations such as presented in step E10 are repeated according to a predefined number of iterations, for example 100 iterations so as to take into account 100 samples of voltage measurements. Accordingly, the method comprises a step E5 of testing the attaining of this predefined number of ignition samples, to ascertain whether the method is in an initialization phase or in a normal operating phase, implementing steps E10, E12 explained above. Within the framework of an initialization phase, the method implements a step of testing end of ignition E3. When this end of ignition is attained, that is to say that the predefined number of ignition iterations is attained, the resulting variables a, b, c are used to define a threshold value in the following manner, in the step of initializing the threshold value E4:

$$\text{threshold} = k \cdot \frac{a - b^2/c}{c - 5}$$

where k is a parameter, chosen between 5 and 200, according to a compromise chosen between two extremes: if k is at the lowest, all the electric arcs are detected, but a risk of false alert exists. If k is higher, the risk of false detection is reduced but the risk of not detecting an electric arc is increased.

According to a second simplified mode of realization, the first indicator is based on the simple computation of the statistical variance. This computation corresponds substantially to considering that the forgetting factor of the first mode of realization exhibits a value equal to 1, the other computations and the various steps then remaining similar to the steps described in the case of the first mode of realization, and to considering the first indicator y through the following formula:

$$y = a/c - (b/c)^2$$

This variance computation will preferably be done on the basis of a sliding window of data x, so as to limit the computation to a chosen number of data, without taking the older data into account. Accordingly, the computation can be reinitialized at regular intervals.

According to a third mode of realization, the first indicator is based on the computation of the interquartile range. Accordingly, a threshold is devised on the basis of the first sampling values, considered in the absence of any electric arc, in a manner similar to the first mode of realization.

Thereafter, a sliding window is adopted, to carry out the computation of the interquartile range at each iteration, at each new datum x, on a predetermined number of sampling values. This amounts, for each new datum obtained, to eliminating the oldest datum considered at the previous iteration. The data are already ranked in ascending (or descending) order, the order arising from the previous iteration of the algorithm. It is then appropriate to input the new datum in this order in the appropriate place so that the order relation is preserved. The first indicator then corresponds to the interquartile range of the sampling of data x obtained at each iteration over a predetermined window. Under these conditions, the computation of the quartiles is very fast since, modulo the ranking of a datum from among n at each iteration, the data of the sliding window are already ordered.

Finally, during the computation of the first indicator, the processing utilizes the finding that the variability of the signal increases appreciably during the occurrence of an electric arc.

However, the first indicator alone does not always suffice to satisfactorily identify the presence of an electric arc, and in particular to differentiate its presence from other phenomena. This is why the first indicator is combined with a second indicator of a different, complementary, nature.

This second indicator corresponds for example to the mean or the median of the sampling of data considered over a sliding window of predefined size. At each iteration, this second indicator is recomputed and compared with a second threshold. The latter can also be deduced from the first values obtained during the initialization phase E2. Indeed, the initial value of the median or of the mean then forms a reference value. A margin is chosen to determine a second threshold during the initialization step E4 mentioned above on the basis of this reference value, beyond which it is considered that the situation corresponds to a risk of electric arc.

According to one mode of realization, the computation of the second indicator is carried out on the basis of the variables b and c defined above within the framework of the first indicator, with the same forgetting factor ϕ. Thus the following value is obtained, estimating the mean m by:

$$m = \frac{b}{c}$$

By way of remark, if this forgetting factor takes the value 1, we obtain the mean over the set of values of the sampling, whereas any value less than 1 of the forgetting factor makes it possible to focus the mean on the most recent sampling data.

According to a more sophisticated mode of realization, the second indicator is based on two sliding estimations of the mean of the signal. The first estimation is an estimation called the high-frequency mean, since it follows the signal in a fine manner while eliminating part of the noise. This first high-frequency estimation or mean $m_{HF}$ is computed on the basis of the variables b and c defined above and with the same forgetting factor ϕ, by the following formula:

$$m_{HF} = \frac{b}{c}$$

Moreover, the second estimation is an estimation called the low-frequency mean since it will be sensitive much less rapidly to variations in the measured signal. This estimation of the low-frequency mean is constructed on the basis of the high-frequency mean defined hereinabove, of the old value of the low-frequency mean as well as of a second forgetting factor ψ very close to 1, for example lying between 0.9 and 1 inclusive, or more generally defined by the table hereinbelow, as a function of the sampling frequency. The low-frequency mean is thus defined by the following formula:

| Sampling frequency $F_{smp}$ | Forgetting factor Ψ lies in the interval |
|---|---|
| 50-300 kHz inclusive | [0.9; 1] |
| 301-750 kHz inclusive | [0.95; 1] |
| 751 KHz-8 Mhz | [0.99; 1] |

Finally, the second indicator z considered is the difference between the two means, high and low frequency:

$$z = m_{HF} - m_{LF}$$

This indicator, which normally always remains close to 0 if there is no jump in the mean value of the signal, is used to detect the occurrence of an electric arc, by comparing with a predefined threshold. As a variant, any other indicator taking both estimations of the means into account can be used. Moreover, any other formula making it possible to obtain two different and complementary estimations of the mean can be used.

Thus, in a general manner, this second indicator will be based on one or more estimations of the mean and/or of the median of a sampling of measured data x.

FIG. 6 summarizes the whole of the electric arc detection method. When the initial phase is terminated, two threshold values threshold1 and threshold2 are fixed. The method then comprises a certain number of iterations in the course of which a voltage value is measured within the photovoltaic installation, so as finally to provide a new sampling datum x representing this voltage measurement. A computation step E10 comprises the implementation of the computation of the two indicators on the basis of a sampling comprising this datum x. A comparison step E12 compares each indicator with respectively its threshold threshold1, threshold2, so as to deduce therefrom the presence of an electric arc only if both thresholds are exceeded. Naturally, this same method is repeated at each measurement according to the chosen sampling frequency for all the voltage measurements carried out at various levels of the photovoltaic installation. As a variant, the computation of the indicators might not be done at each new datum x obtained, but every n data.

Lastly, when an electric arc is detected, the processing unit 8 associated with the photovoltaic installation automatically dispatches a command to make the photovoltaic installation safe, by way of the communication device 9 and of the intervention device 11. This making safe can rely upon remotely controlled breakers. A make safe command can represent an order to interrupt the operation of the photovoltaic system, and this may make it possible to halt the electric arc, thereby eliminating the risk that the sustaining of the electric arc would represent, in particular the risk of fire.

Moreover, the method can also make it possible to recognize, on the basis of the analysed data sampling, whether a detected electric arc is of series or parallel type. It can then engage different make safe actions in the two cases.

Naturally, the safety device 10 advantageously comprises several voltage measurement sensors when the photovoltaic installation is of large dimension, for example one sensor for each photovoltaic module, or for one module out of two or three, and at least one sensor per chain of photovoltaic modules disposed in series, so as to be able to detect any series arc. To obtain a reliable solution, it is possible to equip the device with two voltage measurement sensors per chain of photovoltaic modules disposed in series, the redundancy of these sensors making it possible to alleviate a failure of a sensor. Such a sensor is advantageously directly associated with a particular photovoltaic module, is for example disposed directly within the electronic casing of such a module. The electric arc detection method is implemented in parallel for each measurement of each sensor. This approach thus makes it possible to guarantee the safety of the whole installation and to detect any electric arc as quickly as possible. It also allows precise location of an electric arc, and optionally localized making safe of the photovoltaic installation.

The concept of the invention is not limited to the photovoltaic devices described hereinabove but can be implemented in any sort of photovoltaic installation, with numerous photovoltaic modules.

Figure 9:
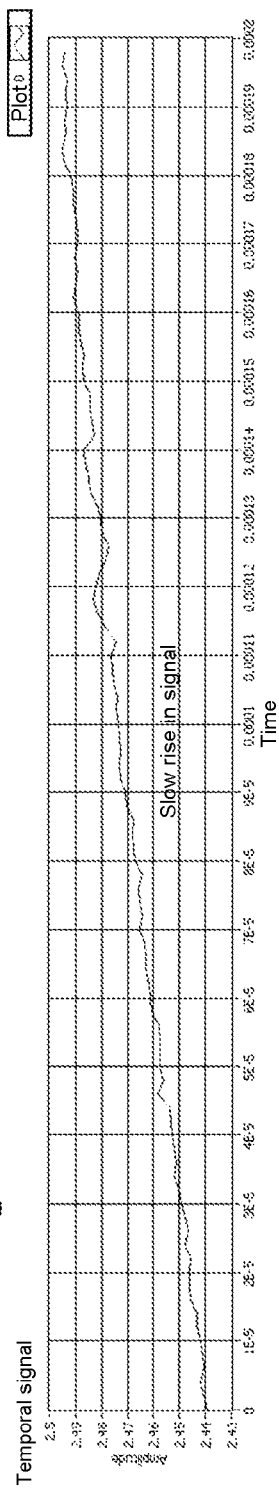
FIG. 9 represents a voltage rise within a photovoltaic installation.
Figure 10:
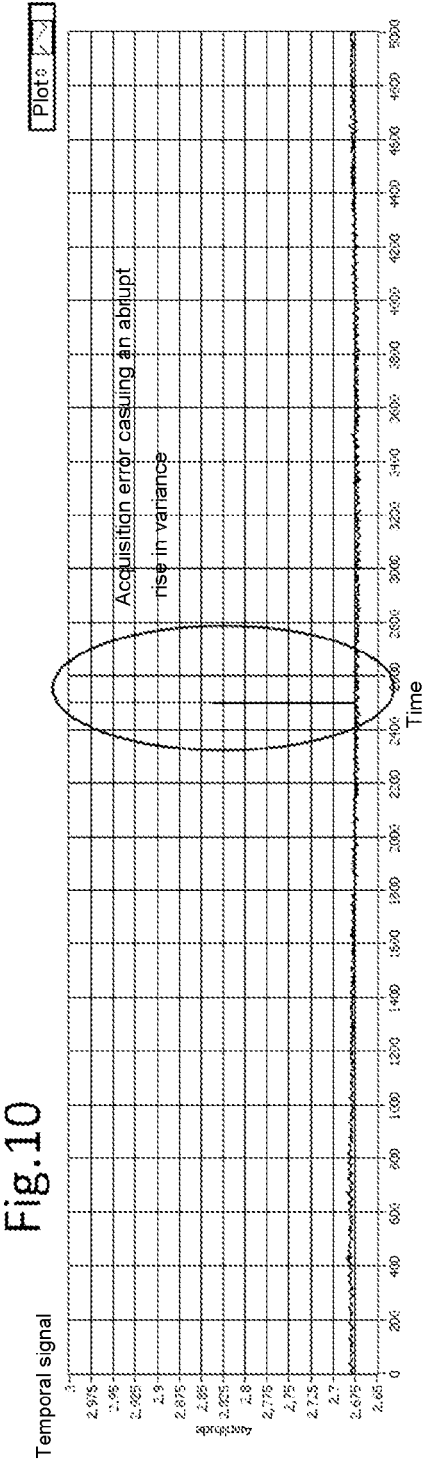
FIG. 10 represents the voltage measured including an acquisition error within a photovoltaic installation.
Figure 11:
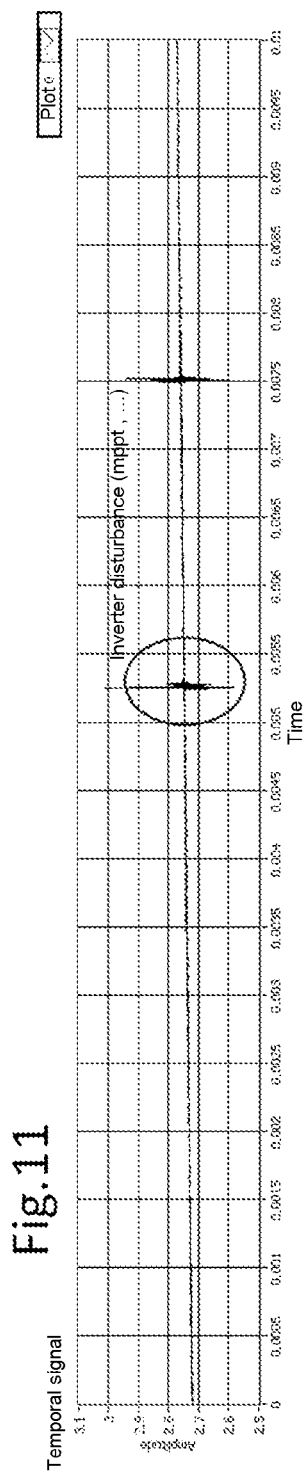
FIG. 11 represents the voltage measured within a photovoltaic installation in the presence of a disturbance at the level of its inverter.

The combination of the above-mentioned two indicators makes it possible notably to obtain reliable recognition of the presence of an electric arc in a photovoltaic installation with very simple computations, not requiring expensive means, which are easy to implement in real time with a high sampling frequency. It thus makes it possible for example to distinguish the occurrence of a series arc, whose signature formed by the evolution of the voltage as a function of time is represented in FIG. 7, or the occurrence of a parallel arc, whose signature formed by the evolution of the voltage as a function of time is represented in FIG. 8. It makes it possible moreover to avoid false detections during neighbouring phenomena which are not caused by an electric arc, such as a simple rise in the voltage such as represented in FIG. 9, an abrupt pointlike rise in the voltage on account of a measurement acquisition error, such as represented in FIG. 10, or a disturbance of the voltage following a disturbance of the operation of the inverter associated with the photovoltaic installation, such as represented in FIG. 11. Naturally, the reliability and the false detection rate of the method are adjustable, as a function of the definition of the thresholds mentioned. Thresholds will advantageously be chosen which make it possible to achieve a 100% detection rate, without any large additional margin to minimize the false detection rate. The method described above lends itself perfectly to the achieving of this objective.

The solution adopted therefore does indeed make it possible to respond to the objects sought and exhibits the following advantages:

as the processing is based on the only measurement of the voltage, the method is simple;
next, as the method implements a digitization so as to undertake simple statistical computations, it is very simple and does not require significant computation power;
this simplified method allows very fast real-time computation;
it achieves great reliability, any electric arc being detected, this being very important for safety;
it achieves a very low false detection rate, thereby minimizing the making safe of the installation unnecessarily;

lastly, the device is simplified to the maximum and therefore inexpensive, since it does not require any filter. As a variant, it remains compatible with the additional and optional use of a filter;

this solution is of course compatible and complementary with other electric arc detection solutions, and can therefore be combined with these other solutions.

The invention claimed is:

1. Method for detecting an electric arc in a photovoltaic installation, comprising:
    measuring voltage values at at least one site of an electrical circuit of the photovoltaic installation;
    digitizing the measured voltage values so as to form a data sampling x;
    computing a first indicator of presence of the electric arc, based on a first statistical computation on the data sampling, wherein the first statistical computation is based on one or more estimations selected from the group consisting of a variance, a value analogous to the variance, and an interquartile range of the data sampling;
    computing a second indicator of presence of the electric arc, based on a second statistical computation on the data sampling, wherein the second statistical computation is based on one or more estimations selected from the group consisting of a mean and a median of the data sampling;
    comparing the first and second indicators of presence of the electric arc with respective first and second thresholds so as to deduce therefrom a presence or absence of the electric arc within the photovoltaic installation.

2. Method for detecting an electric arc in a photovoltaic installation according to claim 1, which takes into account a forgetting factor $\Phi$, wherein at least one selected from the group consisting of (i) the computing of the first indicator of presence of the electric arc is based on the value analogous to the variance and takes into account the forgetting factor $\Phi$, and (ii) the computing of the second indicator of presence of the electric arc takes into account the forgetting factor $\Phi$.

3. Method for detecting an electric arc in a photovoltaic installation according to claim 2, wherein the forgetting factor is combined with each sampling datum x so as to make it possible to define an ever smaller weight to the oldest data of the data sampling at each iteration, so as to take into account the history of the measured voltage values and focus an algorithm on a near time period.

4. Method for detecting an electric arc in a photovoltaic installation according to claim 2, wherein the forgetting factor depends on a sampling frequency.

5. Method for detecting an electric arc in a photovoltaic installation according to claim 4, wherein the forgetting factor is constant and chosen by complying with the rules defined by the following table:

| Sampling frequency $F_{smp}$ | Forgetting factor $\Phi$ lies in the interval |
| --- | --- |
| 50-300 kHz inclusive | [0.965; 0.975] |
| 301-750 kHz inclusive | [0.975; 0.985] |
| 751 KHz-8 Mhz inclusive | [0.985; 0.995]. |

6. Method for detecting an electric arc in a photovoltaic installation according to claim 1, wherein the computing of the first indicator of presence of the electric arc comprises computing three variables a, b, c at each iteration providing a new sampling datum x, by taking account of the history of the variables a, b, c, the square of the new sampling datum $x^2$ and the new sampling datum x.

7. Method for detecting an electric arc in a photovoltaic installation according to claim 6, wherein the computation of the first indicator of presence of the electric arc implements the following computations, repeated for each digitized sampling datum x:
    the three variables a, b, and c are recomputed in the following manner, based on previous values of the three variables a, b and c:

$a \leftarrow \Phi a + x^2$ $b \leftarrow \Phi b + x$ $c \leftarrow \Phi c + 1$ thereafter, the first indicator y of presence of the electric arc is computed based on a formula:

$$y = \frac{a - b^2/c}{c - 5}.$$

8. Method for detecting an electric arc in a photovoltaic installation according to claim 1, wherein the computation of the second indicator of presence of the electric arc implements the following computations, repeated for each digitized sampling datum x:
    two variables b and c are recomputed in the following manner, based on previous values of these variables b and c:

$b \leftarrow \Phi b + x$ $c \leftarrow \Phi c + 1$ wherein $\Phi$ is a forgetting factor lying between 0 and 1 inclusive,
    thereafter, the second indicator m of presence of the electric arc is computed based on a formula:

$m = b/c.$

9. Method for detecting an electric arc in a photovoltaic installation according to claim 1, wherein the second indicator of presence of the electric arc is computed based on a combination of two high and low frequency estimations of the mean of the sampling data.

10. Method for detecting an electric arc in a photovoltaic installation according to claim 9, wherein the computation of the second indicator of presence of the electric arc implements the following computations, repeated for each digitized sampling datum x:
    two variables b and c are recomputed in the following manner, based on previous values of these variables b and c:

$b \leftarrow \Phi b + x$ $c \leftarrow \Phi c + 1$ wherein $\Phi$ is a forgetting factor lying between 0 and 1 inclusive,
    thereafter, a first high-frequency mean estimation $m_{HF}$ is computed based on a formula:

$$m_{HF} = \frac{b}{c}$$

and a second low-frequency mean estimation $m_{LF}$ is computed based on a formula:

$$m_{LF} = \psi m_{LF} + (1-\psi)m_{HF}$$

wherein $\psi$ represents a second forgetting factor lying between 0.9 and 1 inclusive or defined as a function of the sampling frequency by the following table;

| Sampling frequency $F_{smp}$ | Forgetting factor $\Psi$ lies in the interval |
|---|---|
| 50-300 kHz inclusive | [0.9; 1] |
| 301-750 kHz inclusive | [0.95; 1] |
| 751 KHz-8 Mhz | [0.99; 1]. | then the second indicator is computed based on a difference between the high-frequency mean estimation $m_{HF}$ and the low-frequency mean estimation $m_{LF}$.

11. Method for detecting an electric arc in a photovoltaic installation according to claim 1, wherein the method comprises a phase of initializing the method during ignition, the phase of initializing comprising devising a respective threshold value for each of the first and second indicators of presence of an electric arc on the basis of first voltage measurements.

12. Method for detecting an electric arc in a photovoltaic installation according to claim 1, wherein when, during the comparing, the first and second indicators of presence of the electric arc exceed a pre-established threshold value, then the method estimates that the electric arc exists within the photovoltaic installation, and wherein the method then comprises intervening automatically on the electrical circuit of the photovoltaic installation in case of detection of the electric arc, so as to make the photovoltaic installation safe.

13. Safety device for a photovoltaic installation, comprising:
one or more voltage measurement sensor(s), linked by a communication link to a processing unit, wherein the processing unit comprises an analogue-digital converter for digitizing measurements received by the voltage measurement sensor(s),
wherein the processing unit implements the method for detecting an electric arc in the photovoltaic installation according to claim 1.

14. Safety device for a photovoltaic installation according to claim 13, wherein the processing unit is linked by a communication means to an intervention device whose function is to interrupt the electric arc, so as to eliminate risk.

15. Photovoltaic installation, comprising at least one safety device according to claim 13.

16. Method for detecting an electric arc in a photovoltaic installation according to claim 3, wherein the forgetting factor depends on a sampling frequency.

17. Method for detecting an electric arc in a photovoltaic installation according to claim 16, wherein the forgetting factor is constant and chosen by complying with the rules defined by the following table:

| Sampling frequency $F_{smp}$ | Forgetting factor $\Phi$ lies in the interval |
|---|---|
| 50-300 kHz inclusive | [0.965; 0.975] |
| 301-750 kHz inclusive | [0.975; 0.985] |
| 751 KHz-8 Mhz inclusive | [0.985; 0.995]. |

18. Method for detecting an electric arc in a photovoltaic installation according to claim 2, wherein the computing of the first indicator of presence of the electric arc comprises computing three variables a, b, c at each iteration providing a new sampling datum x, by taking account of the history of the variables a, b, c, the square of the new sampling datum $x^2$ and the new sampling datum x.

19. Method for detecting an electric arc in a photovoltaic installation according to claim 6, wherein the computation of the first indicator of presence of the electric arc implements the following computations, repeated for each digitized sampling datum x:
the three variables a, b, and c are recomputed in the following manner, based on previous values of the three variables a, b and c:

$$a \leftarrow \Phi a + x^2$$

$$b \leftarrow \Phi b + x$$

$$c \leftarrow \Phi c + 1$$

thereafter, the first indicator y of presence of the electric arc is computed based on a formula:

$$y = \frac{a - b^2/c}{c - 5}.$$

20. Photovoltaic installation, comprising at least one safety device according to claim 14.

* * * * *